(12) United States Patent
Bhushan et al.

(10) Patent No.: US 8,027,797 B2
(45) Date of Patent: Sep. 27, 2011

(54) METHODS AND APPARATUS FOR DETERMINING A SWITCHING HISTORY TIME CONSTANT IN AN INTEGRATED CIRCUIT DEVICE

(75) Inventors: Manjul Bhushan, Hopewell Junction, NY (US); Mark B. Ketchen, Hadley, MA (US); Dale J. Pearson, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 669 days.

(21) Appl. No.: 12/110,639

(22) Filed: Apr. 28, 2008

(65) Prior Publication Data

US 2009/0271134 A1 Oct. 29, 2009

(51) Int. Cl.
*G01R 25/00* (2006.01)
(52) U.S. Cl. ............... 702/79; 702/64; 702/66; 702/67; 702/69; 702/73
(58) Field of Classification Search ............... 702/79
See application file for complete search history.

(56) References Cited

U.S. PATENT DOCUMENTS

| 6,798,261 | B1 * | 9/2004 | Bhushan et al. ............... 327/172 |
| 6,960,926 | B2 | 11/2005 | Anderson et al. |
| 7,295,057 | B2 | 11/2007 | Bhushan et al. |
| 2008/0068099 | A1 | 3/2008 | Bhushan et al. |

OTHER PUBLICATIONS

Shepard et al., "Body-voltage estimation in digital PD-SOI circuits and its application to static timing analysis" IEEE transaction on computer-aided design of integrated circuits and systems (2001).*

D.J. Pearson et al., "Technique for Rapid, In-Line Characterization of Switching History in Partially Depleted SOI Technologies," IEEE International SOI Conference Proceedings, Oct. 2004, pp. 148-150.
B.L. Ji et al., "On the Connection of SRAM Cell Stability with Switching History in Partially Depleted SOI Technology," Proceedings of the 8th International Conference on Solid-State and Integrated Circuit Technology (ICSICT), Oct. 2006, pp. 788-791.
M.B. Ketchen et al., "Product-Representative 'At Speed' Test Structures for CMOS Characterization", IBM Journal of Research and Development, Jul./Sep. 2006, pp. 451-468, vol. 50, No. 4/5.
M.B. Ketchen et al., "Circuit and Technique for Characterizing Switching Delay History Effects in Silicon-on-Insulator Logic Gates," American Institute of Physics, Review of Scientific Instruments, Mar. 2004, pp. 768-771, vol. 75, No. 3.

* cited by examiner

*Primary Examiner* — Jonathan Teixeira Moffat
*Assistant Examiner* — Hyun Park
(74) *Attorney, Agent, or Firm* — Anne V. Dougherty; Ryan, Mason & Lewis, LLP

(57) ABSTRACT

Techniques for inline measurement of a switching history time constant in an integrated circuit device are provided. A series of pulses is launched into a first stage of a delay chain comprising a plurality of delay stages connected in series and having a length greater than a decay length of at least an initial one of the series of pulses, such that the at least initial one of the series of pulses does not appear at a second stage of the delay chain. An amount of time between the launching of the initial one of the series of pulses and the appearance of at least one of the series of pulses at the second stage of the delay chain is determined. The switching history time constant is calculated as a function of a number of stages traversed by the at least one pulse, the determined amount of time, and the decay length of the at least initial one of the series of pulses based at least in part on a switching history of the integrated circuit device.

20 Claims, 6 Drawing Sheets

FIG. 4

| λ | X | Y | X | Y | X | Y | X | Y | X | Y | X | Y |
|---|---|---|---|---|---|---|---|---|---|---|---|---|
| 0 | 0 | 1 | 0.50 | 1.00 | 0.75 | 1.00 | 0.875 | 1.00 | 0.94 | 1.00 | | |
| 0.1 | 0 | 0.9 | 0.45 | 0.95 | 0.70 | 0.97 | 0.84 | 0.99 | 0.91 | 0.99 | | |
| 0.2 | 0 | 0.8 | 0.40 | 0.89 | 0.65 | 0.94 | 0.79 | 0.97 | 0.88 | 0.98 | | |
| 0.3 | 0 | 0.7 | 0.35 | 0.83 | 0.59 | 0.90 | 0.75 | 0.94 | 0.84 | 0.97 | | |
| 0.4 | 0 | 0.6 | 0.30 | 0.76 | 0.53 | 0.86 | 0.69 | 0.92 | 0.80 | 0.95 | | |
| 0.5 | 0 | 0.5 | 0.25 | 0.69 | 0.47 | 0.81 | 0.64 | 0.88 | 0.76 | 0.93 | | |
| 0.6 | 0 | 0.4 | 0.20 | 0.61 | 0.41 | 0.75 | 0.58 | 0.84 | 0.71 | 0.90 | | |
| 0.7 | 0 | 0.3 | 0.15 | 0.53 | 0.34 | 0.69 | 0.51 | 0.80 | 0.66 | 0.87 | | |
| 0.8 | 0 | 0.2 | 0.10 | 0.44 | 0.27 | 0.62 | 0.44 | 0.75 | 0.59 | 0.83 | | |
| 0.9 | 0 | 0.1 | 0.05 | 0.35 | 0.20 | 0.54 | 0.37 | 0.69 | 0.53 | 0.79 | | |
| 1.0 | | 0.0 | 0.00 | 0.25 | 0.13 | 0.46 | 0.29 | 0.62 | 0.46 | 0.74 | | |
| 1.1 | | | 0.00 | 0.15 | 0.07 | 0.37 | 0.22 | 0.55 | 0.38 | 0.68 | | |
| 1.2 | | | 0.00 | 0.05 | 0.02 | 0.27 | 0.15 | 0.46 | 0.31 | 0.61 | | |
| 1.3 | | | | | 0.00 | 0.17 | 0.09 | 0.38 | 0.23 | 0.54 | | |
| 1.4 | | | | | 0.00 | 0.07 | 0.04 | 0.28 | 0.16 | 0.46 | | |
| 1.5 | | | | | | | 0.00 | 0.18 | 0.09 | 0.37 | | |
| 1.6 | | | | | | | 0.00 | 0.08 | 0.04 | 0.28 | | |
| 1.7 | | | | | | | | | 0.00 | 0.18 | | |
| 1.8 | | | | | | | | | 0.00 | 0.08 | | |
| 1.9 | | | | | | | | | | | | |
| 2.0 | | | | | | | | | | | | |

FIG. 8

| TIME STEP | ENABLE (711) | ARM (713) | LAUNCH (712) |
|---|---|---|---|
| 1 | 1 | 0 | 0 |
| 2 | 1 | 0 | 1 |
| 3 | 1 | 0 | 0 |
| 4 | 1 | 1 | 0 |
| 5 | 1 | 1 | 1 |

FIG. 9

| λ | X | Y | X | Y | X | Y | X | Y | X | Y | X | Y | X | Y |
|---|---|---|---|---|---|---|---|---|---|---|---|---|---|---|
| 0   | 0 | 1   | 0.25 | 1.00 | 0.38 | 1.00 | 0.44 | 1.00 | 0.47 | 1.00 | 0.48 | 1.00 |
| 0.1 | 0 | 0.9 | 0.23 | 0.92 | 0.34 | 0.94 | 0.41 | 0.94 | 0.44 | 0.95 | 0.46 | 0.95 |
| 0.2 | 0 | 0.8 | 0.20 | 0.85 | 0.31 | 0.87 | 0.37 | 0.88 | 0.41 | 0.89 | 0.43 | 0.89 |
| 0.3 | 0 | 0.7 | 0.18 | 0.76 | 0.28 | 0.80 | 0.34 | 0.82 | 0.37 | 0.83 | 0.39 | 0.83 |
| 0.4 | 0 | 0.6 | 0.15 | 0.68 | 0.25 | 0.72 | 0.30 | 0.75 | 0.34 | 0.76 | 0.36 | 0.77 |
| 0.5 | 0 | 0.5 | 0.13 | 0.59 | 0.21 | 0.65 | 0.27 | 0.68 | 0.30 | 0.69 | 0.33 | 0.70 |
| 0.6 | 0 | 0.4 | 0.10 | 0.51 | 0.18 | 0.57 | 0.23 | 0.60 | 0.27 | 0.62 | 0.29 | 0.63 |
| 0.7 | 0 | 0.3 | 0.08 | 0.41 | 0.14 | 0.48 | 0.19 | 0.52 | 0.23 | 0.55 | 0.25 | 0.56 |
| 0.8 | 0 | 0.2 | 0.05 | 0.32 | 0.11 | 0.39 | 0.15 | 0.44 | 0.19 | 0.47 | 0.21 | 0.48 |
| 0.9 | 0 | 0.1 | 0.03 | 0.22 | 0.07 | 0.30 | 0.11 | 0.35 | 0.14 | 0.38 | 0.17 | 0.40 |
| 1.0 | 0 | 0.0 | 0.00 | 0.12 | 0.03 | 0.21 | 0.07 | 0.26 | 0.10 | 0.30 | 0.12 | 0.32 |
| 1.1 |   |     | 0.00 | 0.02 | 0.01 | 0.11 | 0.03 | 0.17 | 0.06 | 0.20 | 0.08 | 0.23 |
| 1.2 |   |     |      |      |      |      | 0.00 | 0.07 | 0.02 | 0.11 | 0.04 | 0.13 |

US 8,027,797 B2

METHODS AND APPARATUS FOR DETERMINING A SWITCHING HISTORY TIME CONSTANT IN AN INTEGRATED CIRCUIT DEVICE

FIELD OF THE INVENTION

The present invention relates generally to measurement of switching history effects in integrated circuit devices and, more particularly, to techniques for determining a switching history time constant in an integrated circuit device.

BACKGROUND OF THE INVENTION

The delay associated with a circuit implemented using partially depleted silicon on insulator (PD-SOI) technology is dependent on its switching history. When a circuit first switches after sitting idle for a few milliseconds (ms) or more it will have a longer or shorter delay than when it switches again within a few nanoseconds (ns). The first switch of the circuit is referred to herein as 1SW, while the second switch is referred to herein as 2SW. The fractional difference of the 1SW and 2SW delays, 1SW/2SW history, can be as much as 10% or more, and can be either positive with 2SW faster, or negative with 1SW faster.

This behavior derives from the floating body of PD-SOI, whose potential directly modulates Metal Oxide Semi-Conductor Field Effect Transistor (MOSFET) threshold voltage (Vt) and is influenced by temperature, operational voltage (VDD), leakage currents, and capacitance. This history effect must be taken into account when gauging technology performance as measured, for example, with ring oscillators. It also impacts specific designs where the relative timing of different paths within a circuit is critical. In addition, the same mechanism that modulates delay also impacts Static Random Access Memory (SRAM) margins, as described in, for example, Brian L. Ji, Hussein I. Hanafi, and Mark B. Ketchen, "On the Connection of SRAM Cell Stability with Switching History in Partially Depleted SOI Technology," *Proceedings of the 2006 8th International Conference on Solid-State and Integrated Circuit Technology* (ICSICT 2006), Shainghai, China, Oct. 23-26, 2006, pp. 788-791, the disclosure of which is incorporated by reference herein.

If the same circuit is switching on a regular basis, every few nanoseconds (ns) or less, it will have a third delay characteristic of steady state operation, referred to herein as SS. SS delay, as measured with a ring oscillator, typically lies somewhere between the 1SW and 2SW delays. The time it takes for a circuit to achieve this steady state is referred to as a floating body relaxation time or a floating body time constant.

Thus, floating body effects in PD-SOI technology introduce switching delay history into the gate delay of logic gates and erode margins of SRAM cells and other memory elements. Evaluation of such effects has typically involved high speed bench tests in an off-line setting. Recently, structures have been demonstrated for measuring some components of switching delay history using only direct current (DC) inputs and outputs, such as those described in Dale J. Pearson, Mark B. Ketchen and Manjul Bhushan, "Technique for rapid, in-line characterization of switching history in partially depleted SOI technologies," 2004 *IEEE International SOI Conference Proceedings*, pp. 148-150, 2004, the disclosure of which is incorporated by reference herein. While these structures provide valuable information on the size of the history, they do not provide any information on the floating body relaxation time.

Floating body relaxation time is a very important parameter for determining impact such as on SRAM margins, where the impact on a given SRAM cell will be a function of the time between successive operations of the cell. Presently the measurement of such time constants remains entirely in the regime of high-speed bench tests, such as those described in Mark B. Ketchen, Manjul Bhushan, and Carl Anderson, "Circuit and Technique for Characterizing Switching Delay History Effects in Silicon on Insulator Logic Gates," *Review of Scientific Instruments*, Vol. 75, No. 2, pp. 768-771, 2004, the disclosure of which is incorporated by reference herein.

It is thus of considerable interest and value to develop a test structure that allows one to routinely measure the floating body time constant as an inline test with only DC inputs and outputs.

SUMMARY OF THE INVENTION

Illustrative embodiments of the present invention provide techniques for inline measurement of a switching history time constant, such as a floating body relaxation time constant with respect to steady state delay in PD-SOI technology.

For example, in one aspect of the invention, a method of inline measurement of a switching history time constant in an integrated circuit device is provided. A series of pulses is launched into a first stage of a delay chain comprising a plurality of delay stages connected in series and having a length greater than a decay length of at least an initial one of the series of pulses, such that the at least initial one of the series of pulses does not appear at a second stage of the delay chain. An amount of time between the launching of the initial one of the series of pulses and an appearance of at least one of the series of pulses at the second stage of the delay chain is determined. The switching history time constant is calculated as a function of a number of stages traversed by the at least one pulse, the determined amount of time, and the decay length of the at least initial one of the series of pulses, based at least in part on a switching history of the integrated circuit device.

In accordance with another aspect of the invention, an integrated circuit device is provided. The integrated circuit device comprises a delay chain comprising a plurality of delay stages connected in series; pulse generation circuitry electrically connected with the delay chain to launch a series of pulses into a first stage of a delay chain comprising a series of stages; and signal delay measurement circuitry electrically connected with the delay chain to determine an amount of time between the launching of an initial one of the series of pulses and an appearance of at least one of the series of pulses at a second stage of the delay chain. The delay chain has a length greater than a decay length of at least the initial one of the series of pulses, such that the at least initial one of the series of pulses does not appear at the second stage of the delay chain.

Illustrative embodiments of the present invention advantageously allow for a rapid inline measurement, using direct-current inputs and outputs, which monitors and tracks the time constant behavior on an ongoing basis so as to detect when that behavior goes outside of the desired or specified range.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 4 is a table illustrating exemplary calculations of five sets of X and Y values for $T_{1/2}$ time steps, according to an embodiment of the present invention;

FIG. 8 is a diagram illustrating sequential inputs for activating the exemplary circuit of FIG. 7;

FIG. 9 is a table illustrating exemplary calculations of six sets of X and Y values for $T_{1/2}(1)$ time steps, according to an embodiment of the present invention;

DETAILED DESCRIPTION OF PREFERRED EMBODIMENTS

The present invention will be described herein in the context of exemplary methods and apparatus for advantageously performing rapid inline measurement of a switching history time constant in an integrated circuit device. It is to be understood, however, that the techniques of the present invention are not limited to the methods and apparatus shown and described herein. Rather, alternative methods and apparatus within the scope of this invention will become apparent to those skilled in the art given the teachings herein.

Although the present invention is described herein primarily with respect to embodiments which measure a floating body time constant in PD-SOI technology, the techniques of the present invention are more generally applicable to measurement of any switching history time constant in an integrated circuit device, such as those associated with, for example, a high-k dielectric. Furthermore, the present invention is described herein primarily with respect to a positive switching history, as found in most practical PD-SOI technologies; however, the concepts of the present invention are more generally applicable and can be extended to the measurement of a time constant associated with, for example, a negative switching history. Moreover, as used herein, the term "direct current" (abbreviated "DC") includes not only constant currents (or voltages) but also currents (or voltages) with very-low frequencies (commonly referred to as "slowly changing DC") and/or other currents having a constant polarity.

Figure 1:
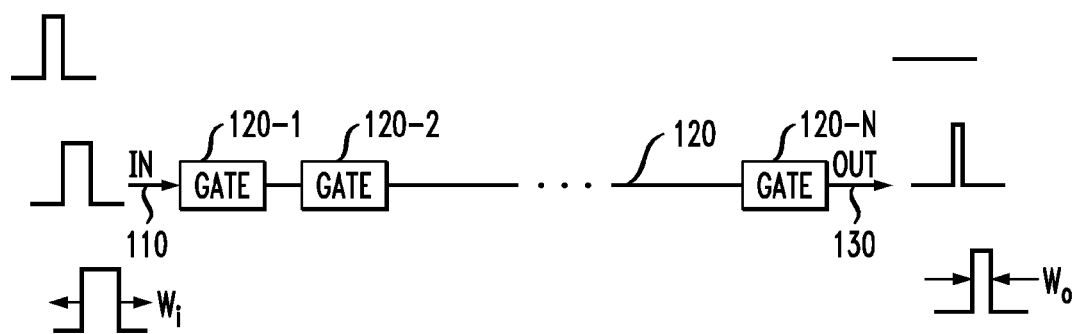
FIG. 1 is a diagram illustrating an exemplary inline delay history effect measurement.

FIG. 1 is a diagram illustrating an exemplary inline delay history effect measurement in PD-SOI which may be used in conjunction with an inline measurement technique, according to an aspect of the present invention. In this illustration, 1SW delay is greater than 2SW delay, corresponding to a positive history. The width of pulse 110 applied (e.g., launched) at the beginning of a long delay chain 120 of PD-SOI inverters (gates 120-1, 120-2, ... 120-N) changes as it travels to the other end of the delay chain, resulting in output 130. The 1SW/2SW history can be defined as the change in pulse width between the beginning and end of the chain ($W_i$-$W_o$) divided by the time for the first edge of the pulse to travel the length of delay chain 120, $D_{ch}$. One way to determine the history is to launch a number of pulses with different $W_i$ values. If $W_i$ is greater than $W_o$, then for some critical initial pulse width $W_{icrit}$ the pulse will be extinguished just as it reaches the far end of the delay chain. The history can then be expressed as $W_{icrit}/D_{ch}$.

In an exemplary embodiment described in commonly-assigned U.S. Pat. No. 6,798,261, the disclosure of which is incorporated by reference herein, a latch is used to generate a single sharp 1SW edge, in response to a slow-rising input signal, which is launched down the delay chain and also into a shorter parallel reference chain. After traversing a preselected number of stages in the reference chain, the signal is fed back to the beginning of the primary delay chain for generating the 2SW edge. Another latch circuit positioned at the far end of the delay chain serves as a pulse detector, the binary output level of which indicates whether or not a pulse emerged from the far end. A decoder is used in conjunction with the reference chain to create different values of $W_i$, which are sequentially launched after successive latch read and reset cycles.

In a preferred embodiment, the primary delay chain has 1200 stages and the reference chain has 16 segments, each with 18 stages, corresponding to 1.5% of the primary chain. The $W_i/D_{ch}$ values thus range from 1.5% to 24% in steps of 1.5%, and the experiment output is a set of "0" values followed by a set of "1" values, where the transition from "0" to "1" defines the history to within 1.5%. For example "0000000011111111" implies that the 1SW/2SW history is between 12% and 13.5%. It is to be understood, however, that the present invention is not limited to any specific number of stages in the primary or reference delay chains.

An exemplary embodiment of the present invention comprises measuring the time it takes for a continuous succession of short pulses ($W_i$<<$W_{icrit}$) launched at one end of a long delay chain to emerge from the other end. The delay chain preferably comprises identical inverting logic gates. For differentiating between the time constants for n-FET and p-FET, the logic gates can be configured so that the gate delays are either n-FET or p-FET dominated; alternatively or additionally, body-contacted devices and/or other devices without a history effect may be used for n-FET or p-FET, respectively.

For any pulse having a width $W_i$ that is less than the critical width $W_{icrit}$, there is a characteristic decay length, λ, corresponding to the distance the pulse travels down the delay chain prior to being extinguished. For example, if the 1SW/2SW history is 12%, a 3.0% pulse will travel a quarter of the length of the delay chain before disappearing. For a given pulse, it is possible to calibrate a distance along the delay chain in units of that pulse's λ value.

Figure 2:
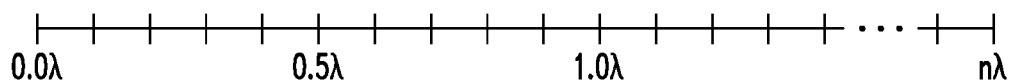
FIG. 2 is a diagram illustrating an exemplary delay chain of inverters calibrated in units of a decay length $\lambda$, according to an embodiment of the present invention.

FIG. 2 shows an exemplary delay chain of inverters calibrated in units of the decay length λ. In the case of positive 1SW/2SW history, if all of the inverters in a short section of the chain experience a long succession of equally spaced pull-up and pull-down transitions, first edge delays will slowly decrease and second edge delays will slowly increase until steady state is achieved in which all edges will move through this section of the chain with the same average delay per stage. If the chain is driven at its beginning by a succession of pulses in the form of a square wave, the width of the pulses will initially linearly decrease from half the pulse period at 0.0λ to zero at 1.0λ, with the waveforms at 0.0λ and 0.5λ as shown in FIG. 3.

If the square wave drive is maintained, the pulses will propagate successively further down the chain as the driven portion of the chain is conditioned. Eventually pulses will travel the full length of the chain and start to appear at the far end. After more time has passed the entire chain will reach steady state with the waveform at all locations having the same shape as at the driven end. If one measures λ and the time from the initiation of the square wave pulse train at the beginning of the delay chain until the first pulses appear at the far end, one can calculate the floating body relaxation time, as will be demonstrated below.

Figure 3:
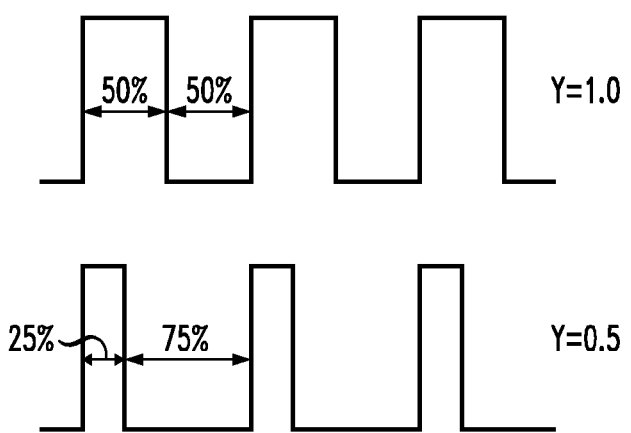
FIG. 3 is a diagram illustrating initial pulse trains at 0.0 λ and 0.5 λ, according to an embodiment of the present invention.

Let Y=2(pulse width/pulse period), as shown in FIG. 3 for Y=1.0 and Y=0.5. Let X=1−(Δd)/(Δd)$_o$ where (Δd)$_o$=d (1SW)−d(2SW) and (Δd)=delay difference between first and second edges of some successive pulse. If a set of gates experiences a continuous succession of pulses with Y=1.0, then for a delay chain characterized by a single time constant, τ:

$$(\Delta d) = (\Delta d)_o e^{-t/\tau} \quad [1]$$

The time constant τ is both the characteristic time for the delay difference to relax and correspondingly for the floating body to relax to the steady state configuration. Equation 1 can be rewritten as:

$$X(t) = [1 - e^{-t/\tau}] \quad [2]$$

For other constant values of Y less than unity this can be generalized as:

$$X(t) = Y[1 - e^{-t/\tau}] \quad [3]$$

At a time $t_0$, for some point along the delay chain that has already experienced some level of preconditioning, X(t) can be expressed as:

$$X(t) = X(t_0) + [Y - X(t_0)][1 - e^{-t/\tau}], \quad [4]$$

where t is now the elapsed time since our observation at time $t_0$, and Y is assumed to be essentially constant during time interval t. For the special case of $t = T_{1/2}$, this expression becomes:

$$X(T_{1/2}) = X(t_0) + 0.5[Y - X(t_0)] = 0.5[Y + X(t_0)] \quad [5]$$

If the values of X are known at all points along the delay chain, then the values of Y at all points along the delay chain can be sequentially calculated using the expression:

$$Y(a+0.1\lambda) = Y(a) - 0.1[1 - 0.5\{X(a) + X(a+0.1\lambda)\}] \quad [6]$$

For example, near the time that the square wave excitation at the beginning of the delay chain is initiated, the value of X is zero at all points along the delay chain and Y will linearly decrease from 1 at 0.0λ to zero at 1.0λ as previously mentioned.

Given the above relationships, it follows that this problem lends itself to an iterative numerical solution. In particular, if the system can be characterized by a single time constant, then for $T_{1/2}$ time steps:

$$X_{ij} = 0.5[X_{i,j-1} + Y_{i,j-1}] \text{ and} \quad [7]$$

$$Y_{ij} = Y_{i-1,j} - 0.1[1 - 0.5(X_{ij} + X_{i-1,j})] \text{ with } Y_{0j} = 1 \quad [8]$$

where i is the index for 0.1λ steps along the delay chain and j is the index for $T_{1/2}$ time steps. If necessary, higher precision can be obtained using smaller time steps.

For j=0, the values of X and Y are as previously described. For j=1, Equation [7] is first used to calculate the new X values. These new X values may then be used with Equation [8] to calculate the new set of Y values. Note, that non-zero Y values will now start to appear at and to the right of the 1.0λ point on the delay chain. The iteration is then continued in similar fashion for successively higher values of j until non-zero Y values propagate all the way to the far end of the delay chain. From these numerical results, one may obtain an expression that is anticipated to be of the form:

$$T = \eta(n-1)T_{1/2} \quad [9]$$

where T is the time from the initiation of the square wave pulse train at the beginning of the delay chain until the first pulses appear at the far end and η is a constant determined from the iterative solution. Knowing T and n, one can calculate $T_{1/2}$ and thus τ.

FIG. 4 is a table showing the first five sets of X and Y values for $T_{1/2}$ time steps, calculated according to the exemplary method described above. From this table, it is evident that Equation [9] above describes the progression of the leading edge on non-zero Y values down the chain with η=5.

Figure 5:
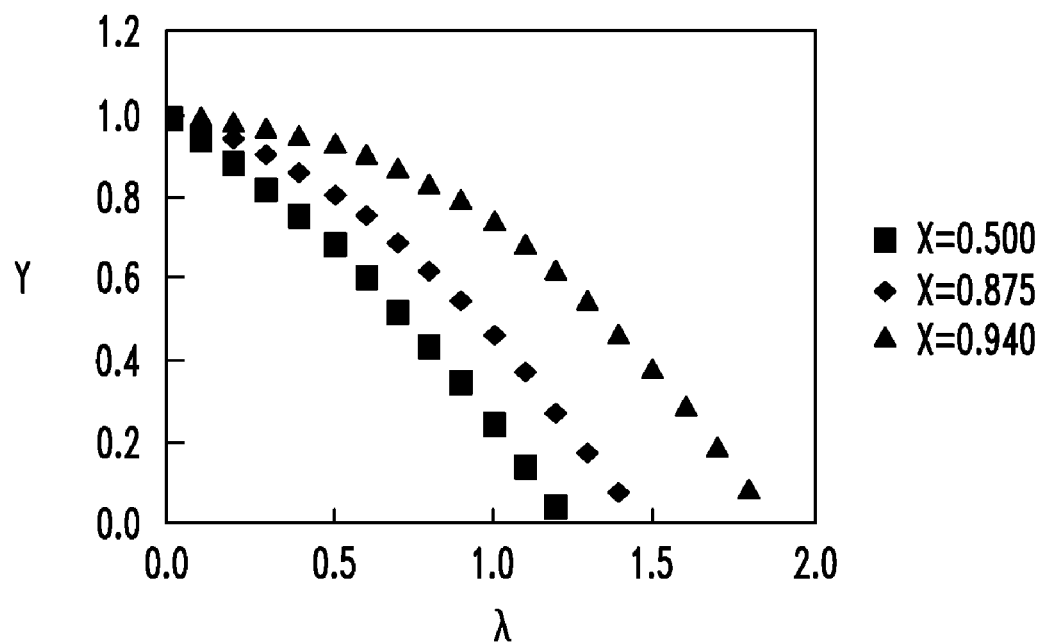
FIG. 5 is a graph illustrating a calculation of Y as a function of λ at different sequential times, according to an embodiment of the present invention.

FIG. 5 is a graph plotting Y as a function of λ at different times as pulses progress successively further down the delay chain for a single time constant, in accordance with the illustrative methodology described herein. These sequential times are represented by values of X and the values plotted are taken from FIG. 4. The squares represent X=0.500; the diamonds represent X=0.875; and the triangles represent X=0.940. This shows how the delay chain becomes progressively more conditioned as time advances. After a sufficiently long period of time, the entire delay chain will have the value Y=1.

Figure 6:
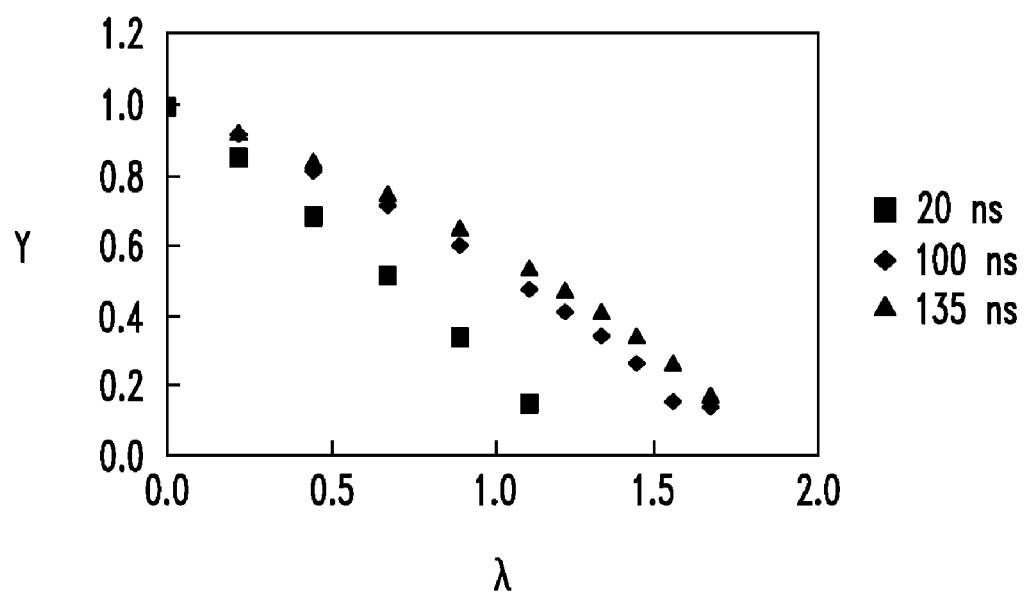
FIG. 6 is a graph illustrating a calculation of Y as a function of λ at different sequential times obtained by circuit simulations, according to an embodiment of the present invention.

FIG. 6 is another graph plotting Y as a function of λ. Here though, the values are obtained from circuit simulations using industry standard compact circuit models (e.g., BSIM). The data shown in FIGS. 5 and 6 are qualitatively similar. The differences in the two plots are mainly because of the simplifying assumption of a single time constant in FIG. 5.

Figure 7:
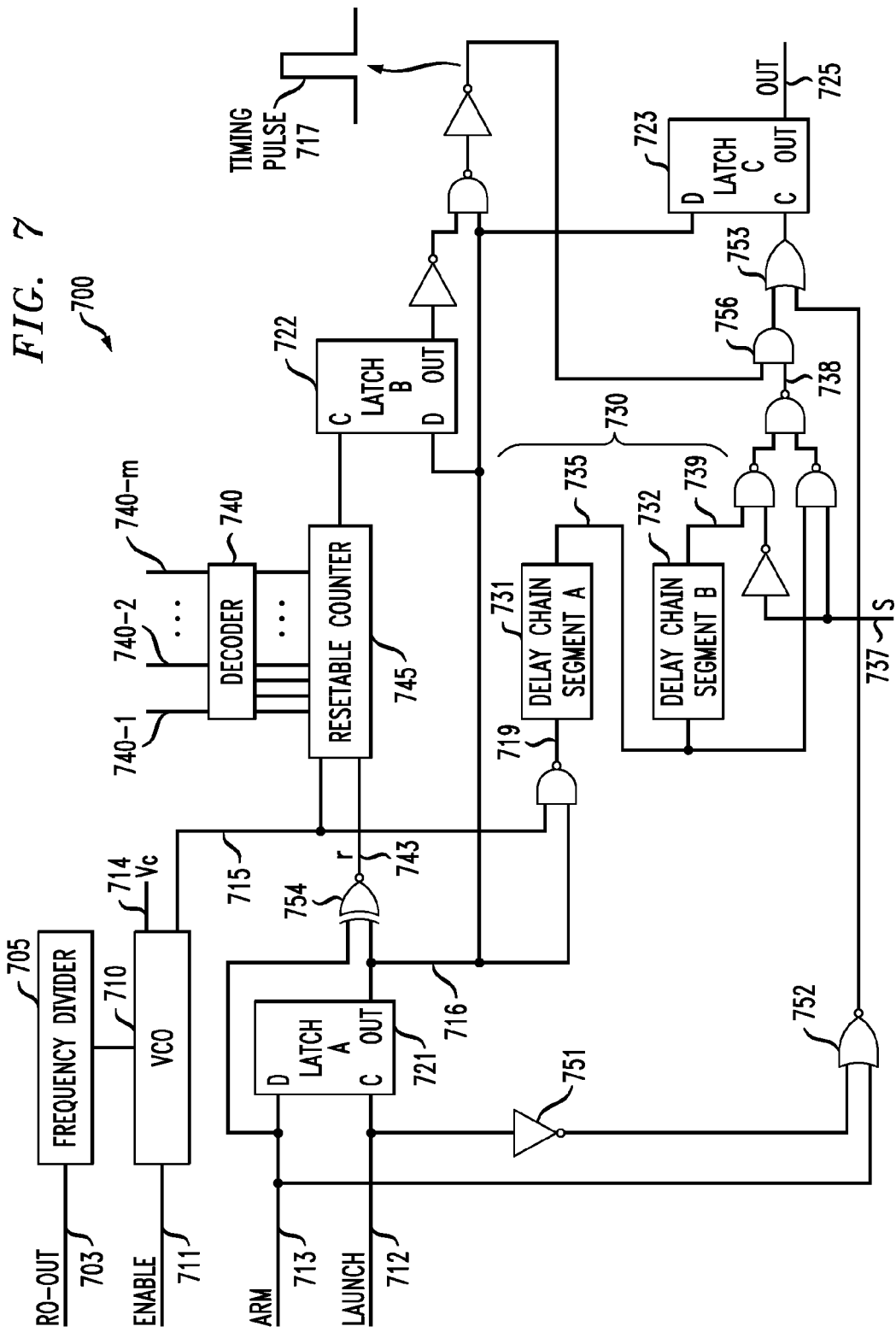
FIG. 7 is a schematic diagram illustrating an exemplary circuit, according to an embodiment of the present invention.

FIG. 7 is a schematic diagram depicting an exemplary circuit 700, which may be used in conjunction with an illustrative embodiment of the inventive technique, as described above. Circuit 700 has a voltage controlled adjustable frequency ring oscillator (VCO) 710, which in response to a sharp edge 716 derived, for example, with a first latch (LatchA) 721 from a low speed input signal (Launch) 712, provides a square wave signal 719 to a delay chain 730 comprising a first portion, segment A (731), and a second portion, segment B (732), and simultaneously to a resetable counter 745. Resetable counter 745, in conjunction with a second latch (LatchB) 722 and a decoder 740, is used to create a timing pulse 717 whose width is determined by the decoder inputs 740-1, 740-2, . . . , 740-m, where m is an integer greater than one. The output from delay chain 730 (e.g., signal 738) and timing pulse 717 generated by the resetable counter 745 are preferably combined by AND gate 756 preceding a third latch (LatchC) 723 in such a way that an output signal (OUT) 725 generated by latch 723 remains at a logic "0" level (e.g., zero volts) if the signal emerges from the end 739 (or midpoint 735, depending on input signal S 737) of the delay chain 730 sufficiently ahead of the falling edge of the timing pulse 717, but switches to a logic "1" level (e.g., positive supply voltage, Vdd) if the signal emerges from the end 739 (or midpoint 735) of the delay chain 730 ahead of the falling edge of the timing pulse 717. The pulse generator functionality of circuit 700 is similar to that described in commonly-assigned U.S. Pat. No. 7,295,057, as well as Mark B. Ketchen and Manjul Bhushan, "Product representative 'at speed' test structures for CMOS characterization," *IBM Journal of R & D*, vol. 50, pp. 451-468, 2006, the disclosures of which are incorporated by reference herein.

The VCO 710 is preferably enabled by setting the input signal Enable (711) to a logic "1" level. Square wave signal 715 generated by the VCO 710 preferably serves as an on-chip clock as well as the input drive for the delay chain 730. "DC" Launch signal 712 initiates the generation of a sharp rising edge 716 for timing pulse 717 and commences resetable counter 745. At a selectable time after the generation of the first pulse edge of timing pulse 717, a signal is sent from the resetable counter 745 to create the falling edge of the pulse. Latch 721 is used for creating the rising edge of timing pulse 717. With a logic "1" preloaded into the data input (D) of latch 721 (e.g., via input signal Arm 713) and with its output (Out) at logic "0" initially, the output timing pulse 717 will remain at a logic "0" until the signal Launch 712 applied to the clock input (C) of latch 721 is of sufficient magnitude to allow the loaded "1" at the data input of latch 721 to pass to the output of the latch. The only requirement for the Launch signal 712 is that it undergoes a transition from "0" to "1." The characteristics of the waveform of the Launch signal 712, including the duration of the transition, are not critical. The output signal 716 from latch 721 will be a very sharp edge that is generated at some point during the transition of the Launch signal 712 from a logic low level (e.g., "0") to a logic high level (e.g., "1"), when the voltage level of the Launch signal 712 rises above a prescribed threshold value, and subsequent events are self-timed with respect to this sharp edge 716.

The output 716 of latch 721, which generates the leading edge of the timing pulse 717, preloads a "1" into the data input of latch 722 and latch 723, and also deactivates the reset signal 743 (r) to the resetable counter 745 via an exclusive-NOR gate 754. Specifically, a first input of exclusive-NOR gate 754 is adapted to receive the control signal Arm 713, a second input of exclusive-NOR gate 754 is connected to the output of latch 721, and an output of exclusive-NOR gate 754 is connected to the resetable counter 745 and is operative to generate the reset signal 743. With the reset signal 743 deactivated (e.g., logic "0"), counter 745 starts counting (either up or down), preferably one count for each for period of the output clock signal 715 generated by VCO 710, to a prescribed count value determined by inputs 740-1, 740-2, . . . , 740-m to decoder 740. Counter 745 will generate an output signal 749 once the prescribed count value is reached which is indicative of certain amount of elapsed time following the rising edge of the timing pulse 717. Signal 749 is then applied to the clock input of latch 722 which is waiting with the preloaded "1" generated by latch 721. Next, the output from latch 722 is preferably inverted and combined with the original data input 716 to latch 722 to form the falling edge of the timing pulse 717.

The same output signal 716 from latch A 721 generated by VCO 710 that forms the leading edge of the timing pulse 717 and triggers resetable counter 745 also initiates the square wave input 719 to delay chain 730. The input signal 719 to delay chain 730 may be generated as a logical NAND function of the output signal 716 from latch 721 and the output signal 715 from the VCO 710. If the output pulse 738 from delay chain 730 appears at the AND gate 756 preceding the clock input of latch 723 while signals 716 and 717 are at a logic "1" level, then the output signal 725 of latch 723 will make a transition from logic "0" to logic "1" and remain at logic "1" until the next initialization cycle. If such an input does not come while signals 716 and 717 are at a logic "1" level, then the output 725 of latch 723 will remain at logic "0."

FIG. 8 shows an exemplary set of sequential input signals, namely, Enable signal 711, Launch signal 712, and Arm signal 713, operative to initialize latches 721, 722 and 723, generate timing pulse 717, and initiate the square wave input 719 to delay chain 730. Each timing step (e.g., 1 through 5) is preferably a few milliseconds in length, although the invention is not limited to any particular duration of the timing step. Timing steps 1 through 3 function to reset latches 721, 722 and 723, ensuring that there is a logic "0" at the latch outputs.

Note, that during timing step 2, counter 745 is counting and the clock input (signal 749) to latch 722 is oscillating. Since the data input to latch 722 will be a logic "0" at this time, the output of latch 722 will be set to a logic "0." At the same time, the Arm signal 713 and Launch signal 712, which is inverted by inverter 751, are combined through a two-input logical NOR gate 752 to place a logic "1" on one of the inputs to a two-input logical OR gate 753. The output of OR gate 753 is fed to the clock input of latch 723. However, with the output 716 of latch 721 at logic "0," the data input of latch 723 will be a logic "0." Thus, the output signal 725 of latch 723 is thus also set to a logic "0" during timing step 2.

In timing step 3, launch input 712 is toggled from "1" to "0" which has immediate impact on the circuit. In timing step 4, Arm signal 713 is set to a logic "1" level, thereby preloading the data input of latch 721 with a logic "1." In timing step 5, with the Enable signal 711, Launch signal 712 and Arm signal 713 all set to a logic "1" level, timing pulse 717 is created and the square wave input signal 719 to the delay chain 730 is initiated, as heretofore described.

By way of example only and without loss of generality, consider a preferred embodiment of circuit 700 which includes a delay chain 730 of two segments, segment 731 being 501 stages in length and segment 732 being 500 stages in length, with each stage comprising a loaded inverter having a delay per stage of about 10 picoseconds (ps). The delay of the entire chain 730 will thus be about 10 ns. It is to be appreciated that the invention is not limited to any particular number of stages in the delay chain, nor is it limited to any particular delay per stage. VCO 710 may be implemented as a tunable ring oscillator having an adjustable frequency, f, ranging from, for example, about 5 GHz (e.g., 100 ps pulse width) to about 250 MHz (e.g., 2ns pulse width) and a two-input NAND gate, or alternative gating device (not explicitly shown), used in conjunction with the Enable signal 711 to turn the ring oscillator on and off, as will become apparent to those skilled in the art. Resetable counter 745 may be configured as a series of 32 (e.g., k=1 to 32) divide-by-two stages, the output point of which is selected with the 5-bit decoder 740 (e.g., via a multiplexer or alternative switching arrangement, not explicitly shown). The period of VCO 710 will be 1/f and the corresponding pulse width of signal 715 generated by the VCO will preferably be 1/(2f). The pulse width of timing pulse 717, selected as a function of the control bits 740-1 through 740-$m$ presented to decoder 740, will be $(1/2f) \times 2^k$ ns.

In the single time constant case discussed above with a 1SW/2SW history of 10%, a 1 ns pulse launched at the beginning of the delay chain 730 will vanish to zero width just at it arrives at the far end of the chain (e.g., signal 739), while a 500 ps wide pulse will vanish to zero width as it arrives at the midpoint tap (e.g., signal 735) between segment 731 and segment 732. With signal S737 set to logic "1," and a width of timing pulse 717 set to 1/(2f)×4, the VCO Enable input signal 711 is set to logic "1" and input signal Vc 714 applied to VCO 710 is adjusted to the maximum ring oscillator frequency (fmax) at which a pulse is sensed at the midpoint output tap 735 from delay chain 730, about 1 GHz corresponding to the 500 ps pulse width. Note that with this setting of the counter, for each complete timing cycle, at most only two pulses can emerge from the delay chain midpoint tap 735 while timing pulse 717 is on and essentially no conditioning of delay chain 730 will have yet occurred. Fmax can be directly measured as the divided down output of the ring oscillator (RO_OUT 703). Using a frequency divider 705 with ten serially connected divide-by-two stages, the VCO frequency is divided down by a factor of 1024 to a range of about 0.25-5 MHz, which is in the range routinely measured using standard low frequency inline measurement instrumentation. Signal Vc 714 is then adjusted such that the VCO 710 frequency is, for example, (2×fmax)=2 GHz. At this frequency and corresponding drive pulse width (e.g., 250 ps), the length of the entire delay chain 730 is preferably 4λ.

The history time constant measurement methodology is next conducted using circuit 700 and the method heretofore described. With the output at the far end 739 of delay chain 730, the method is repeatedly initialized and exercised with different settings (e.g., as a function of signals 740-1 through 740-m) for decoder 740, most conveniently corresponding to monotonically increasing 2× timesteps (up to k=32) in the width of the timing pulse. Output 725 from latch 723 will be measured and recorded at the conclusion of each cycle. At completion, the measured outputs can be organized as a sequence of "0" values followed by a sequence of "1" values. The location of the boundary between the "0" and "1" values reveals within a factor of two the time from the initial square wave excitation of the beginning of delay chain 730 to the time that pulses start to emerge from the far end 739 of the delay chain. Knowing this time and the length of delay chain 730, 4λ, one can then calculate $T_{1/2}$ using equation [9] above.

For example, with a VCO 710 frequency f of 2 GHz, if the timing pulse width 717 boundary is between z=17 and z=18 (corresponding to 8.2 and 16.4 microseconds (μs), respectively), then from equation [9], $T_{1/2}$ can be determined to be between 0.55 μs and 1.1 μs. The precision of the measurement can be increased ten-fold or more by using a more sophisticated higher resolution counter 745, examples of which will be known by those skilled in the art. A similar set of measurements can be made at the delay chain midpoint 735 with pulse width values for timing pulse 717 reduced by approximately a factor of three, along with similar values for $T_{1/2}$ as determined with the full chain 730, although the measurement will be less precise.

Note, that in the above procedure, only direct current (DC) inputs and outputs are involved (e.g., frequencies of a few MHz or less). Critical events are self-timed, and the overall timing calibration for the methodology is achieved through adjustment and readout of the VCO. All of these actions can be implemented on a standard parametric tester so that this structure can be routinely measured as an inline test. Note also that, strictly speaking, the history time constant is measured, but the history itself is not, since the delay per stage of the delay chain is not measured. If desired this can be accomplished by incorporating an additional separate ring oscillator comprised of stages substantially identical to those of the delay chain 730, from which the steady state stage delay can be obtained from another frequency measurement, as described in commonly-assigned U.S. Patent Application Publication No. 2008/0068099, the disclosure of which is incorporated by reference herein.

In the more general case, multiple time constants will be involved, the two time constant case heretofore described being an example of this. For such a situation, an extension of the approach described above can be invoked. In general, Δd may be comprised of more than one component with more than a single time constant. For example in the case of an inverter the pull-down delay is dominated by the nFET characteristics, while the pull-up is dominated by the pFET characteristics. The bodies of the nFET and pFET may have different relaxation times. For example, consider the case where Δd is made up of two components, $\Delta d_1$ and $\Delta d_2$, characterized by time constants $\tau_1$ and $\tau_2$ respectively. At time=0, $(\Delta d)_o$ 32 $(\Delta d_1)_o + (\Delta d_2)_o = \gamma_1(\Delta d)_o + \gamma_2(\Delta d)_o$, where $\gamma_1 + \gamma_2 = 1$. As an extension of the analysis done for the single time constant case, let $$X_1 = \gamma_1 - (\Delta d_1)/(\Delta d)_o \text{ and } X_2 = \gamma_2 - (\Delta d_2)/(\Delta d)_o \quad [10]$$

with $X = X_1 + X_2 = 1 - (\Delta d)/(\Delta d)_o$ where $(\Delta d)_o = d(1SW) - d(2SW)$ and $(\Delta d) =$ delay difference between first and second edges of some successive pulse, but now made up of two components $(\Delta d_1)$ and $(\Delta d_2)$ If a set of gates experiences a continuous succession of pulses with Y=1.0, then for a situation characterized by two time constants, $\tau_1$ and $\tau_2$, we will have:

$$(\Delta d) = \gamma_1(\Delta d)_o e^{-t/\tau 1} + \gamma_2(\Delta d)_o e^{-t/\tau 2} \quad [11]$$

This equation can be rewritten as:

$$X(t) = \gamma_1[1 - e^{-t/\tau 1}] + \gamma_2[1 - e^{-t/\tau 2}] \quad [12]$$

For other constant values of Y less than unity this can be generalized as:

$$X(t) = Y\gamma_1[1 - e^{-t/\tau 1}] + Y\gamma_2[1 - e^{-t/\tau 2}] \quad [13]$$

If at a time $t_0$ we examine some point along the delay chain that has already experienced some level of preconditioning, then X(t) can be expressed as:

$$X(t) = X_1(t_0) + X_2(t_0) + [Y\gamma_1 - X_1(t_0)][1 - e^{-t/\tau 1}] + [Y\gamma_2 - X_2(t_0)][1 - e^{-t/\tau 2}] \quad [14]$$

where t is now the elapsed time since our observation at time $t_0$, and it is assumed that Y is essentially constant during time interval t.

This formulation for two time constants can be directly extended to any number of time constants with the introduction of additional X, and γ, and τ parameters.

As with the single time constant case much insight can be gained by looking at numerical calculations with timesteps of $T_{1/2}$. Consider as an example the case of $\gamma_1 = \gamma_2 = 0.5$, with $\tau_1 \ll \tau_2$. For times much greater than $\tau_1$ but still much less than $\tau_2$, from equation [14] the expression corresponding to equation [5] for the single time constant case then becomes:

$$X(T_{1/2}(1)) = X_1(T_{1/2}(1)) = 0.5[0.5Y + X_1(t_0)] \quad [15]$$

As with the single time constant case, if the values of X are known at all points along the delay chain then the values of Y at all points along the delay chain can be sequentially calculated using the expression:

$$Y(a+0.1\lambda) = Y(a) - 0.1[1 - 0.5\{X(a) + X(a+0.1\lambda)\}] \quad [16]$$

Given the above relationships, one can derive an iterative numerical solution. For $T_{1/2}(1)$ time steps we will have:

$$X_{ij} = 0.5[X_{i,j-1} + 0.5Y_{i,j-1}], \text{ and} \quad [17]$$

$$Y_{ij} = Y_{i-1,j} 0.1[1 - 0.5(X_{ij} + X_{i-1,j})] \text{ with } Y_{0j} = 1 \quad [18]$$

These equations will give a very different behavior than the single time constant case previously described. After many $T_{1/2}(1)$ time steps the leading edge of non-zero Y values will advance only so far down the delay chain and then stop. For the case under discussion this distance will be less than 2.0λ from the beginning of the chain. To qualitatively understand this think first of the related problem in which $(\Delta d)_o = (\Delta d_2)_o$ with $(\Delta d_2)_o$ the same as in the present problem, and there is no $\tau_1$ component at all. Then for t<<$\tau_2$, Y will go to 0 at 2.0λ. In the present problem, the existence of $X_1$ values along the chain of less than $\gamma_1$ will force Y to go to 0 even sooner than at 2.0λ.

FIG. 9 is a table illustrating exemplary calculations of six sets of X and Y values for $T_{1/2}(1)$ time steps, according to an embodiment of the present invention. Specifically, the table shows exemplary results of a spreadsheet calculation using equations [17] and [18] above with $T_{1/2}(1)$ timesteps proceeding to the right.

A numerical calculation for $\tau_1 \ll \tau_2$ and $t > \tau_2$ is a more complex problem; however, from the above equations and the single time constant results it is clear that the behavior will again become one with the non-zero Y value boundary advancing constant distance steps down the delay chain with each $T_{1/2}(2)$ timestep. With more than two time constants, the behavior will always, in the end, be dominated by the longest time constant with the non-zero Y value boundary moving down the delay chain at a substantially constant speed.

For the multiple time constant situation the experimental approach described above for a single time constant can again be invoked. The value of $T_{1/2}$ determined can still be used as an effective time constant to characterize the technology and can be easily monitored as an inline measurement. For a more detailed analysis one or more internal tap points can be incorporated in the delay chain (such as internal tap point 735 in delay chain 730 in FIG. 7) and the time for the oscillation to reach the various points along the delay chain can be measured. For the single time constant case, this time will be linear in the distance along the chain, while for a multiple time constant situation, the times to advance successive equal chain segments will initially increase and then settle to equal time increments characteristic of the longest time constant component. This behavior can then be correlated with a model whose parameters can be adjusted to represent the observed behavior as well as with bench test data from other structures that allow direct measurement of the relaxation, such as those described in commonly-assigned U.S. Pat. No. 6,960,926, the disclosure of which is incorporated by reference herein.

At least a portion of the circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Figure 10:
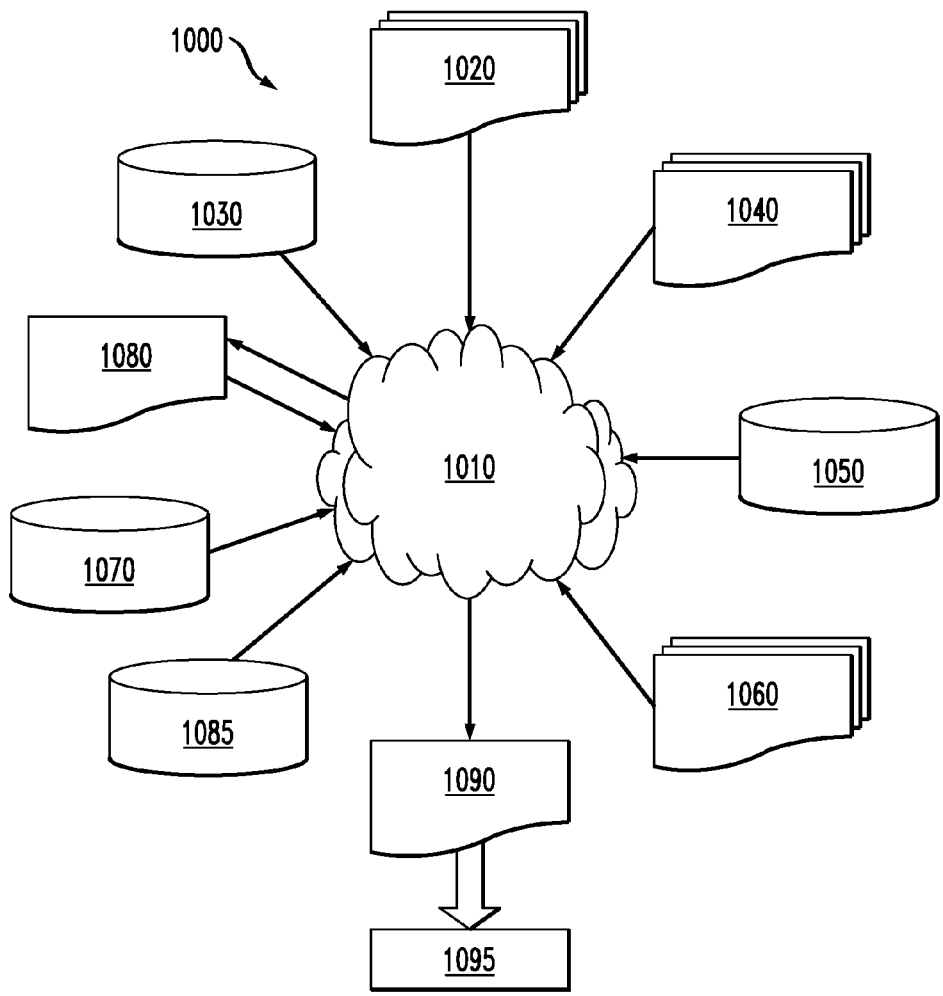
FIG. 10 is a flow diagram of a design process used in semiconductor design, manufacture, and/or test.

FIG. 10 shows a block diagram of an exemplary design flow 1000 used for example, in semiconductor design, manufacturing, and/or test. Design flow 1000 may vary depending on the type of integrated circuit (IC) being designed. For example, a design flow 1000 for building an application specific IC (ASIC) may differ from a design flow 1000 for designing a standard component. Design structure 1020 is preferably an input to a design process 1010 and may come from an IC provider, a core developer, or other design company or may be generated by the operator of the design flow, or from other sources. Design structure 1020 comprises an embodiment of the invention as shown in FIG. 7 in the form of schematics or HDL, a hardware-description language (e.g., Verilog, VHDL, C, etc.). Design structure 1020 may be contained on one or more machine readable medium. For example, design structure 1020 may be a text file or a graphical representation of an embodiment of the invention as shown in FIG. 7. Design process 1010 preferably synthesizes (or translates) an embodiment of the invention as shown in FIG. 7 into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in FIG. 7, along with any additional integrated circuit design or data (if applicable), into a second design structure 1090. Design structure 1090 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1090 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 7. Design structure 1090 may then proceed to a stage 1095 where, for example, design structure 1090: proceeds to tape-out, is released to manufacturing, is released to a mask house, is sent to another design house, is sent back to the customer, etc.

Figure 11:
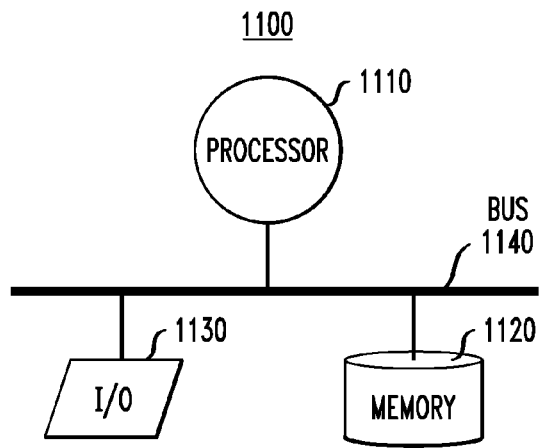
FIG. 11 is a block diagram depicting an exemplary processing system in which inventive techniques may be implemented.

The methodologies of embodiments of the invention may be particularly well-suited for use in an electronic device or alternative system. For example, FIG. 11 is a block diagram depicting an exemplary processing system 1100 formed in accordance with an aspect of the invention. System 1100 may include a processor 1110, memory 1120 coupled to the processor (e.g., via a bus 1140 or alternative connection means), as well as input/output (I/O) circuitry 1130 operative to interface with the processor. The processor 1110 may be configured to perform at least a portion of the methodologies of the present invention, illustrative embodiments of which are shown in the above figures and described herein.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 1110. In any case, it is to be appreciated that at least a portion of the components shown in the above figures may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of inline measurement of at least one switching history time constant in an integrated circuit device comprising the steps of:
   transmitting a series of pulses into a first stage of a delay chain, the delay chain comprising a plurality of delay stages connected in series and having a length greater than a decay length of an initial one of the series of pulses, such that the initial one of the series of pulses does not appear at a second stage of the delay chain;
   determining an amount of time between the transmitting of the initial one of the series of pulses and an initial appearance of the series of pulses at the second stage of the delay chain, wherein the initial appearance of the series of pulses at the second stage of the delay chain comprises an appearance at the second stage of the delay chain of one of the series of pulses other than the initial one of the series of pulses, and
   calculating the at least one switching history time constant as a function of a number of stages between the first stage and the second stage, the determined amount of time, and the decay length of the initial one of the series of pulses, based at least in part on a switching history of the integrated circuit device.

2. The method of claim 1, wherein the series of pulses comprises a square wave.

3. The method of claim 1, further comprising the step of adjusting at least one of a pulse width and a frequency of the series of pulses.

4. The method of claim 1, wherein the first stage and the second stage are at opposite ends of the delay chain.

5. The method of claim 1, wherein at least one of the first stage and the second stage are at an internal tap point within the delay chain.

6. The method of claim 1, wherein a stage of the delay chain comprises at least one loaded inverter.

7. The method of claim 1, further comprising the step of measuring a delay per stage of the delay chain.

8. The method of claim 7, further comprising the step of calculating the switching history based at least in part on the measured delay per stage of the delay chain.

9. The method of claim 1, wherein the at least one switching history time constant comprises at least one floating body relaxation time constant.

10. An article of manufacture for inline measurement of at least one switching history time constant in an integrated circuit device, comprising non-transitory machine readable storage medium with one or more programs stored therein for causing a computer processor to perform the steps of:
    transmitting a series of pulses into a first stage of a delay chain, the delay chain comprising a plurality of delay stages connected together in series and having a length greater than a decay length an initial one of the series of pulses, such that the initial one of the series of pulses does not appear at a second stage of the delay chain;
    determining an amount of time between the transmitting of the initial one of the series of pulses and an initial appearance of the series of pulses at the second stage of the delay chain, wherein the initial appearance of the series of pulses at the second stage of the delay chain comprises an appearance at the second stage of the delay chain of one of the series of pulses other than the initial one of the series of pulses; and
    calculating the at least one switching history time constant as a function of a number of stages between the first stage and the second stage, the determined amount of time, and the decay length of the initial one of the series of pulses, based at least in part on a switching history of the integrated circuit device.

11. An integrated circuit device comprising:
    a delay chain comprising a plurality of delay stages connected in series;
    pulse generation circuitry electrically connected with the delay chain to transmit a series of pulses into a first stage of the delay chain, the delay chain having a length greater than a decay length of an initial one of the series of pulses, such that the initial one of the series of pulses does not appear at a second stage of the delay chain; and
    signal delay measurement circuitry electrically connected with the delay chain to determine an amount of time between the transmitting of the initial one of the series of pulses and an initial appearance of the series of pulses at the second stage of the delay chain, wherein the initial appearance of the series of pulses at the second stage of the delay chain comprises an appearance at the second stage of the delay chain of one of the series of pulses other than the initial one of the series of pulses.

12. The device of claim 11, wherein the series of pulses comprises a square wave.

13. The device of claim 11, wherein the pulse generation circuitry comprises pulse modulation circuitry to adjust at least one of a pulse width and a frequency of the series of pulses.

14. The device of claim 11, wherein the first stage and the second stage are at opposite ends of the delay chain.

15. The device of claim 11, wherein at least one of the first stage and the second stage are at an internal tap point within the delay chain.

16. The device of claim 11, wherein a stage of the delay chain comprises at least one loaded inverter.

17. The device of claim 11, further comprising a ring oscillator comprised of stages identical to those of the delay chain.

18. The device of claim 11, wherein the at least one switching history time constant comprises at least one floating body relaxation time constant.

19. Signal delay measurement circuitry integrated with a delay chain to determine an amount of time between transmitting of an initial one of a series of pulses into a first stage of the delay chain and an initial appearance of the series of pulses at a second stage of the delay chain, the delay chain having a length greater than a decay length of the initial one of the series of pulses, such that the initial one of the series of pulses does not appear at the second stage of the delay chain, wherein the initial appearance of the series of pulses at the second stage of the delay chain comprises an appearance at the second stage of the delay chain of one of the series of pulses other than the initial one of the series of pulses.

20. A design structure embodied in non-transitory machine readable storage medium, the design structure comprising:

a delay chain comprising a plurality of delay stages connected in series; pulse generation circuitry electrically connected with the delay chain to transmit a series of pulses into a first stage of the delay chain, the delay chain having a length greater than a decay length of an initial one of the series of pulses, such that the a initial one of the series of pulses does not appear at a second stage of the delay chain; and signal delay measurement circuitry electrically connected with the delay chain to determine an amount of time between the launching transmitting of the initial one of the series of pulses and an initial appearance of the series of pulses at the second stage of the delay chain, wherein the initial appearance of the series of pulses at the second stage of the delay chain comprises an appearance at the second stage of the delay chain of one of the series of pulses other than the initial one of the series of pulses.

* * * * *